US012232365B2

(12) United States Patent
Okazaki et al.

(10) Patent No.: US 12,232,365 B2
(45) Date of Patent: Feb. 18, 2025

(54) DISPLAY DEVICE

(71) Applicant: SHARP KABUSHIKI KAISHA, Sakai (JP)

(72) Inventors: Shoji Okazaki, Sakai (JP); Tohru Okabe, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 746 days.

(21) Appl. No.: 17/598,167

(22) PCT Filed: Apr. 4, 2019

(86) PCT No.: PCT/JP2019/014938
§ 371 (c)(1),
(2) Date: Sep. 24, 2021

(87) PCT Pub. No.: WO2020/202525
PCT Pub. Date: Oct. 8, 2020

(65) Prior Publication Data
US 2022/0173182 A1    Jun. 2, 2022

(51) Int. Cl.
H10K 59/122    (2023.01)
H10K 50/818    (2023.01)
H10K 59/12     (2023.01)
H10K 59/131    (2023.01)
H10K 71/00     (2023.01)
H10K 77/10     (2023.01)
H10K 102/00    (2023.01)
H10K 102/10    (2023.01)

(52) U.S. Cl.
CPC .......... H10K 59/122 (2023.02); H10K 71/00 (2023.02); H10K 50/818 (2023.02); H10K 59/1201 (2023.02); H10K 59/131 (2023.02); H10K 77/111 (2023.02); H10K 2102/103 (2023.02); H10K 2102/311 (2023.02)

(58) Field of Classification Search
CPC ............ H10K 2102/311; H10K 77/111; H10K 59/122
See application file for complete search history.

(56) References Cited

U.S. PATENT DOCUMENTS 10,170,534 B1 * 1/2019 Kim ................. H01L 27/124
2017/0125505 A1 * 5/2017 Oh .................. H10K 59/80
2018/0301665 A1   10/2018 Sakamoto

FOREIGN PATENT DOCUMENTS

JP    2018-181668 A    11/2018

* cited by examiner

Primary Examiner — Vincent Wall
(74) Attorney, Agent, or Firm — ScienBiziP, P.C.

(57) ABSTRACT

A display device (2) includes: a planarization film; and a light-emitting-element layer including an anode, an edge cover, an EL active layer, and a cathode in this sequence. The display device further includes: a first photospacer and a second photospacer each having a surface thereof covered by the cathode; and a lightning rod photospacer (44) including a second projection portion (44b) that is a part of the planarization film and having a surface thereof covered by a first metal film (44c) made of the same material and in the same layer as the anode.

11 Claims, 9 Drawing Sheets

DISPLAY DEVICE

TECHNICAL FIELD

The disclosure relates to display devices.

BACKGROUND ART

Various flat panel display devices have been developed. In particular, display devices have been attracting attention that include QLEDs (quantum dot light-emitting diodes) or OLEDs (organic light-emitting diodes) as electroluminescence elements.

Patent Literature 1 discloses a display device including QLEDs in which an organic layer is formed by vapor deposition.

CITATION LIST

Patent Literature

Patent Literature 1: Japanese Unexamined Patent Application Publication, Tokukai, No. 2018-181668 (published Nov. 15, 2018)

SUMMARY

Technical Problem

In vapor-depositing an organic layer, the vapor deposition mask or the vapor-deposition-target substrate, or both, may have an electric charge. This electric charge could cause ESD (electrostatic discharge) between the vapor deposition mask and a pixel electrode on the vapor-deposition-target substrate, which in turn can lead to a surge current flowing to a pixel transistor via the pixel electrode. Consequently, the display device could exhibit undesirably low manufacturing yield and reliability due to, for example, a shift in the operating voltage threshold of the pixel transistor or a degradation of the current-voltage characteristics of the pixel transistor.

In view of these problems, it is an object of the disclosure to provide a display device that exhibits high manufacturing yield and reliability.

Solution to Problem

To achieve this object, the disclosure, in an aspect thereof, is directed to a display device including: a substrate; a thin film transistor layer on the substrate, the thin film transistor layer including an inorganic insulation film, a first line, and a planarization film in this sequence; and a light-emitting-element layer including a first electrode, an edge cover, a light-emitting layer, and a second electrode in this sequence, the edge cover covering an end of the first electrode and having an opening therein so as to expose the first electrode, the display device having a display area and a frame area surrounding the display area, the display device further including: a first photospacer in the display area, the first photospacer projecting from the edge cover and having a surface thereof covered by the second electrode; a second photospacer in the frame area, the second photospacer projecting from the planarization film and having a surface thereof covered by the second electrode; and a third photospacer in either one or both of the display area and the frame area, the third photospacer including the planarization film and having a surface thereof covered by a first metal film made of a same material and in a same layer as the first electrode.

Advantageous Effects of Disclosure

The disclosure, in an aspect thereof, provides a display device that exhibits high manufacturing yield and reliability.

Figure 2:
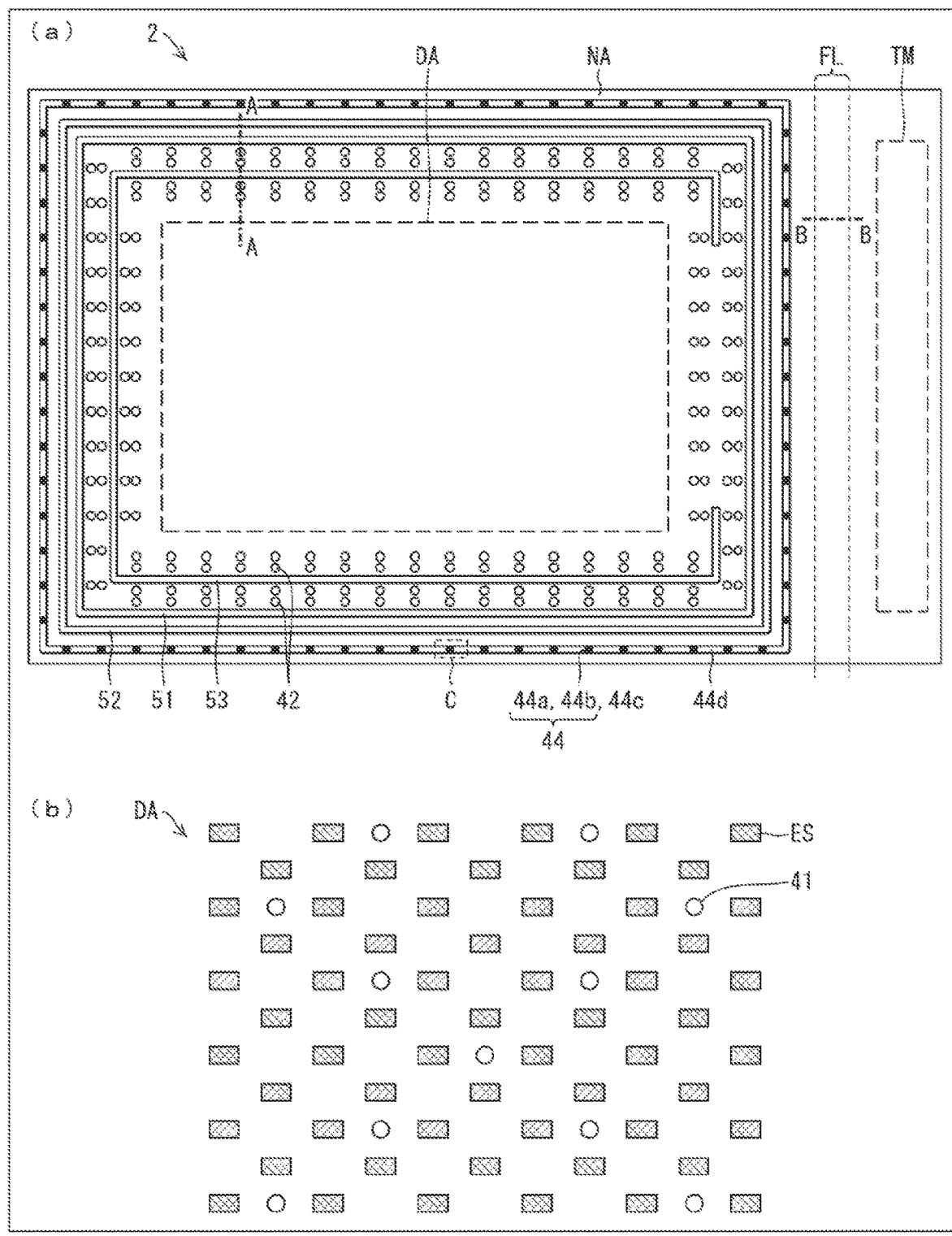

Portion (a) of FIG. 2 is a schematic plan view of an exemplary structure of a display device in accordance with Embodiment 1 of the present invention, and (b) of FIG. 2 is an enlarged schematic plan view of a structure of a display area of the display device shown in (a) of FIG. 2.

Figure 3:
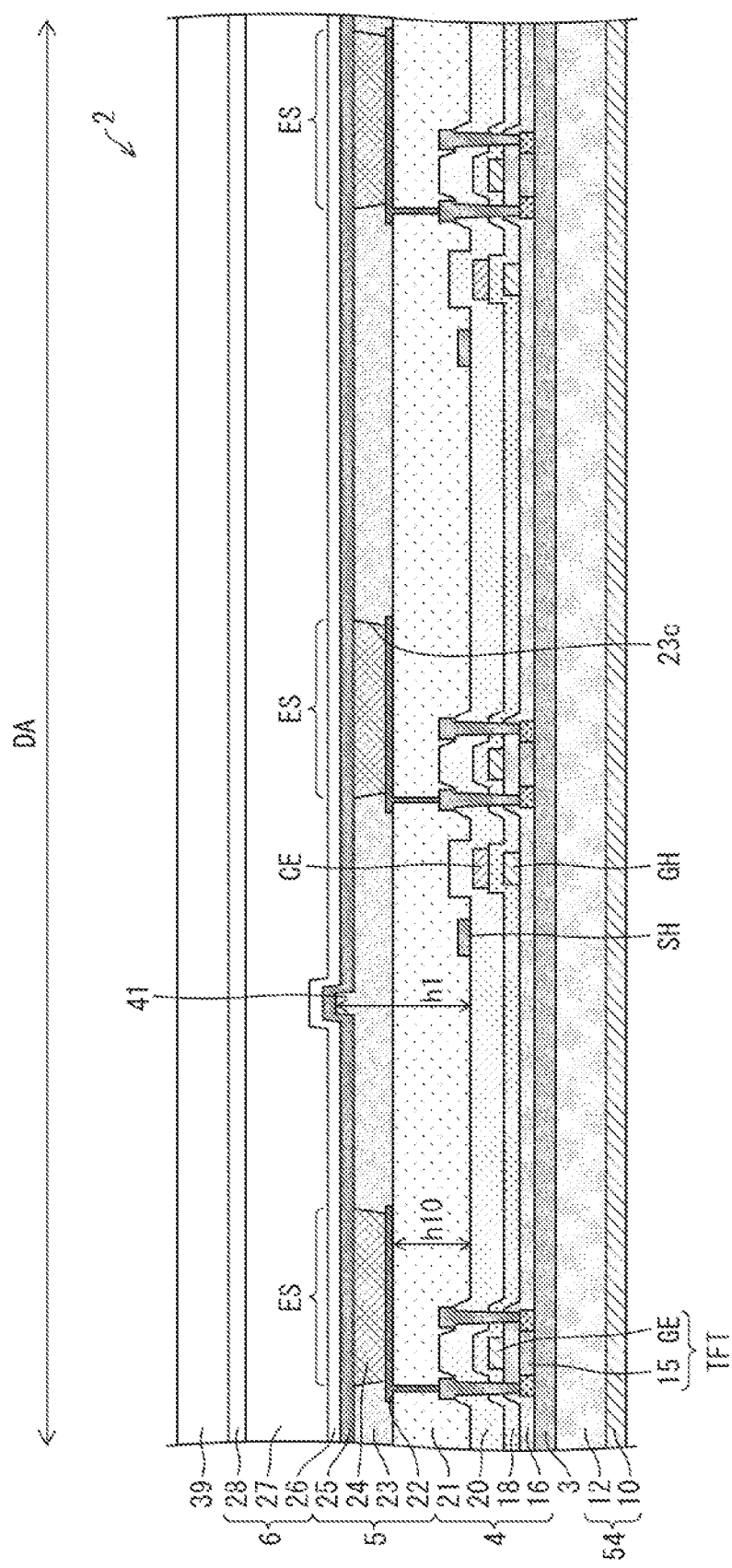

FIG. 3 is a schematic cross-sectional view of the structure of the display area shown in (b) of FIG. 2.

Figure 4:
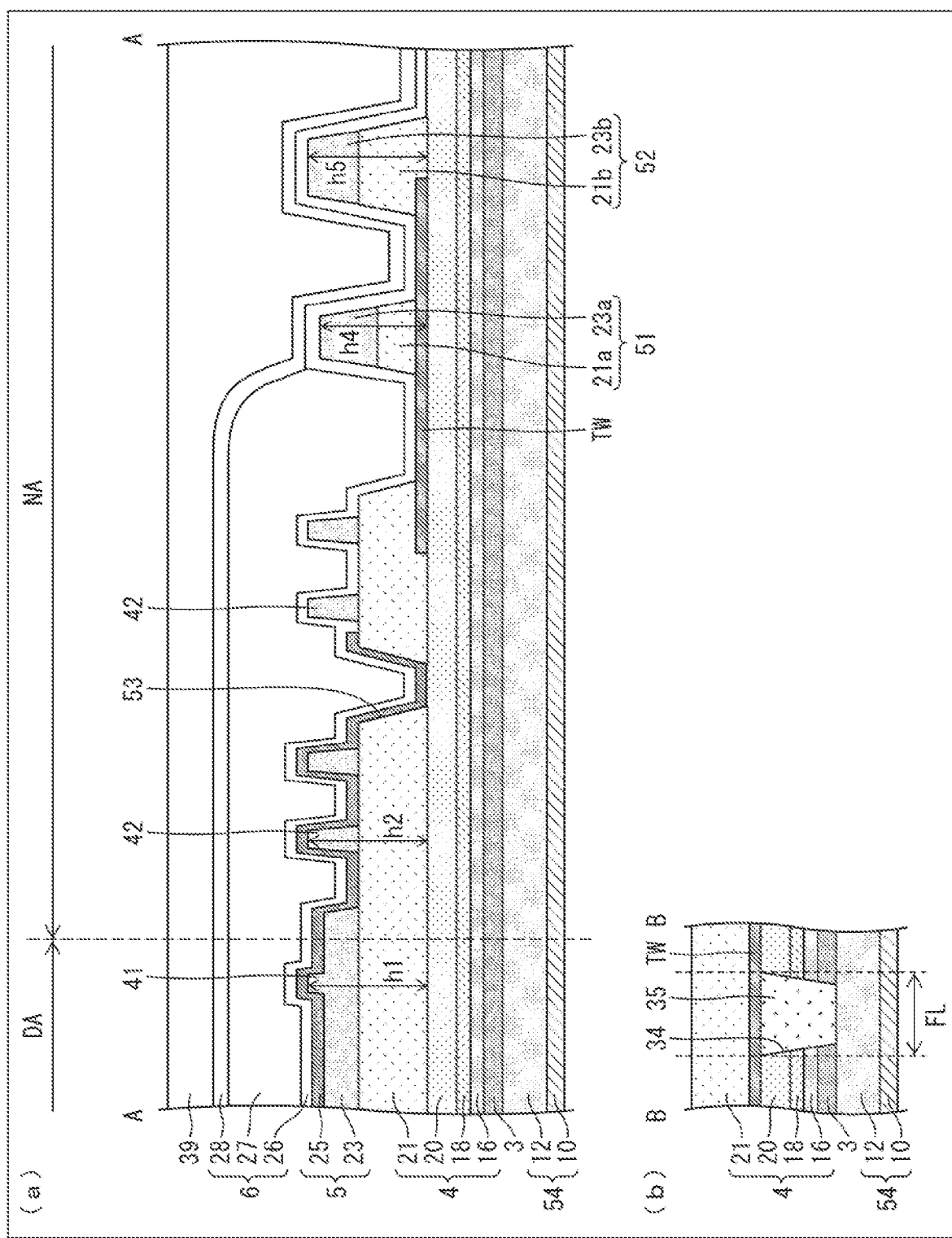

Portion (a) of FIG. 4 is a cross-sectional view of the display device shown in (a) of FIG. 2 taken along line A-A, and (b) of FIG. 4 is a cross-sectional view of the display device shown in (a) of FIG. 2 taken along line B-B.

Figure 5:
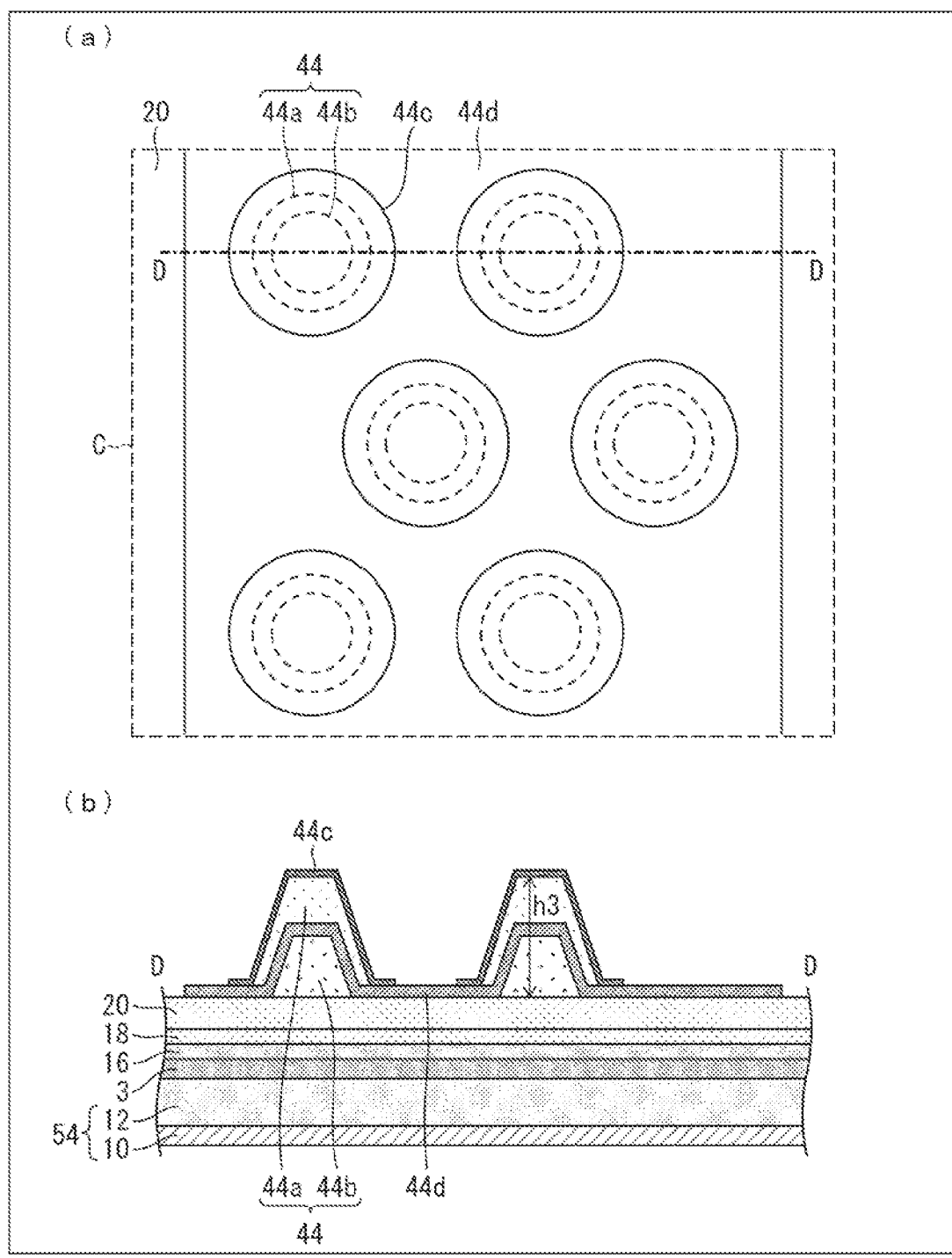

Portion (a) of FIG. 5 is an enlarged schematic plan view of an exemplary structure of a portion C of the display device shown in (a) of FIG. 2, and (b) of FIG. 5 is a cross-sectional view of the portion C shown in (a) of FIG. 5 taken along line D-D.

Figure 6:
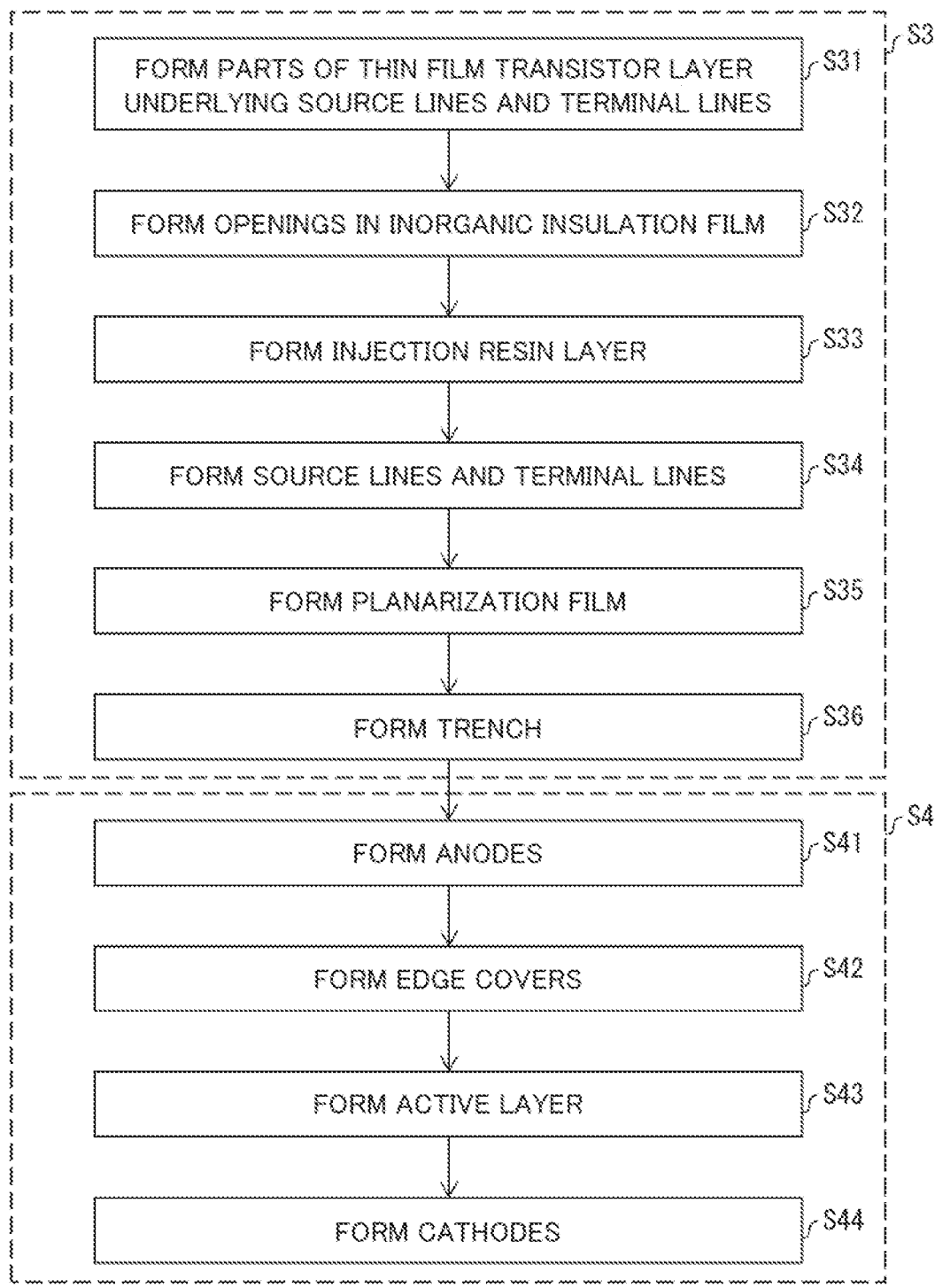

FIG. 6 is a flow chart representing a part of an exemplary method of manufacturing the display device shown in (a) of FIG. 2.

Figure 7:
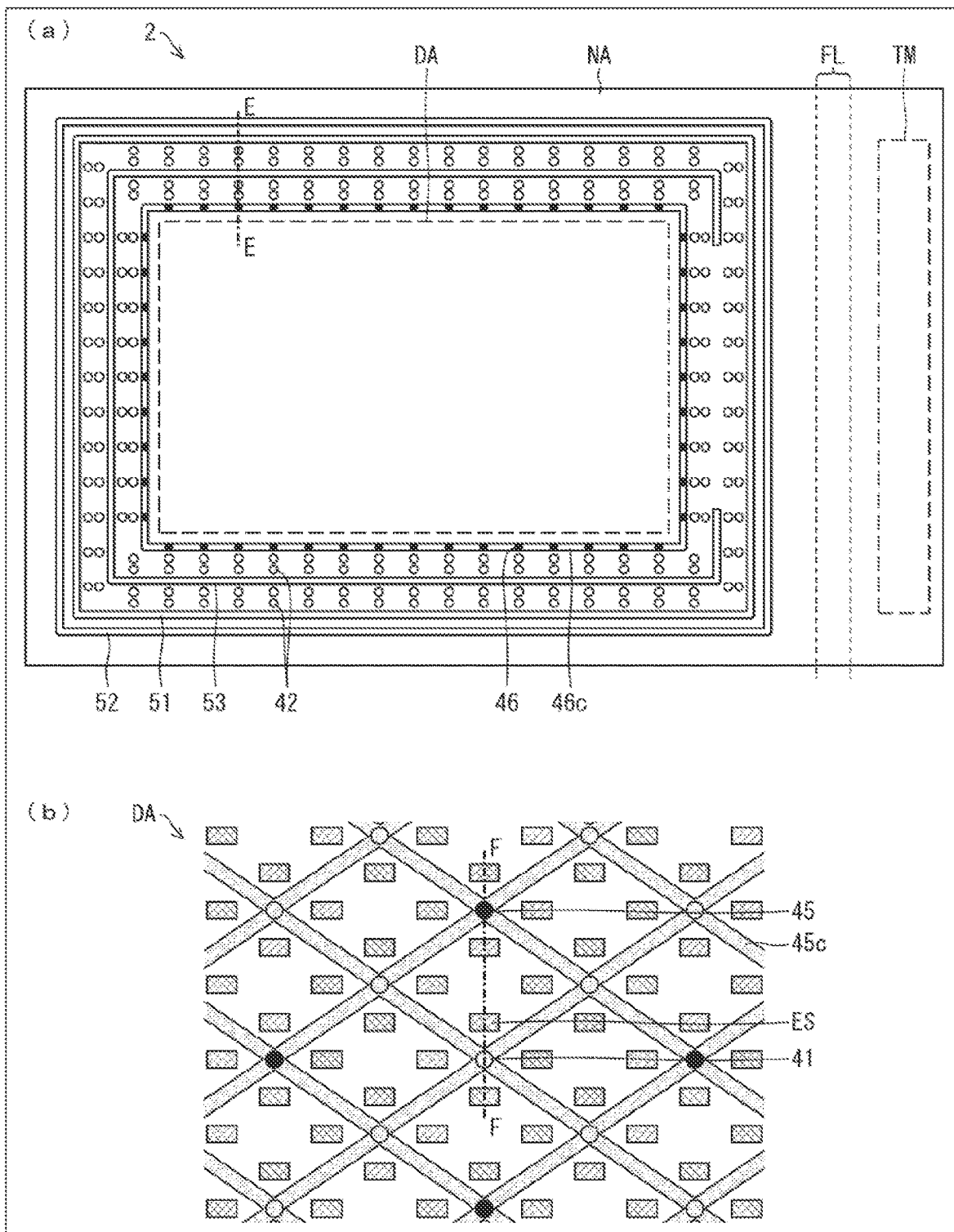

Portion (a) of FIG. 7 is a schematic plan view of an exemplary structure of a display device in accordance with Embodiment 2 of the present invention, and (b) of FIG. 7 is an enlarged schematic plan view of a structure of a display area of the display device shown in (a) of FIG. 7.

Figure 8:
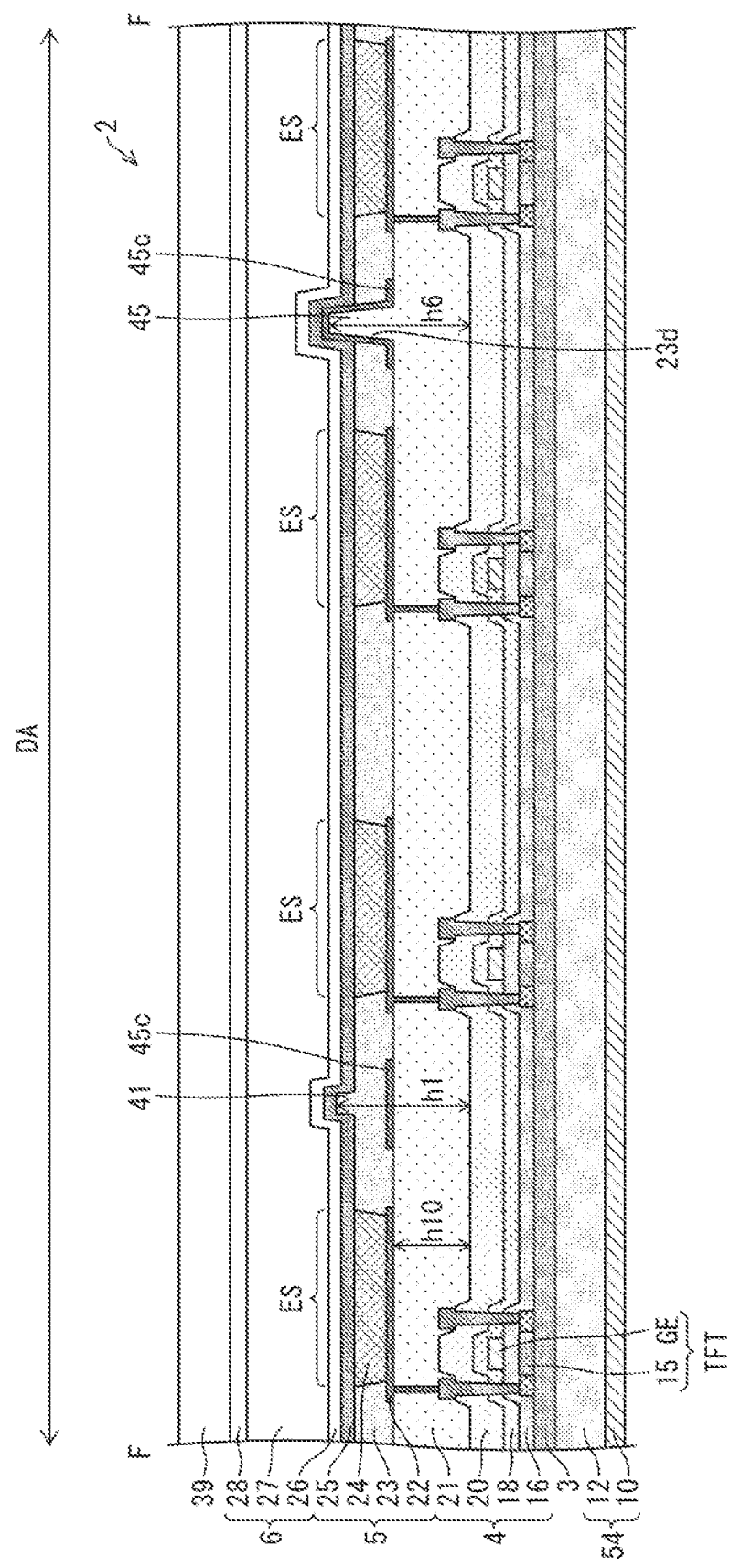

FIG. 8 is a schematic cross-sectional view of the structure of the display area shown in (b) of FIG. 7 taken along line F-F.

Figure 9:
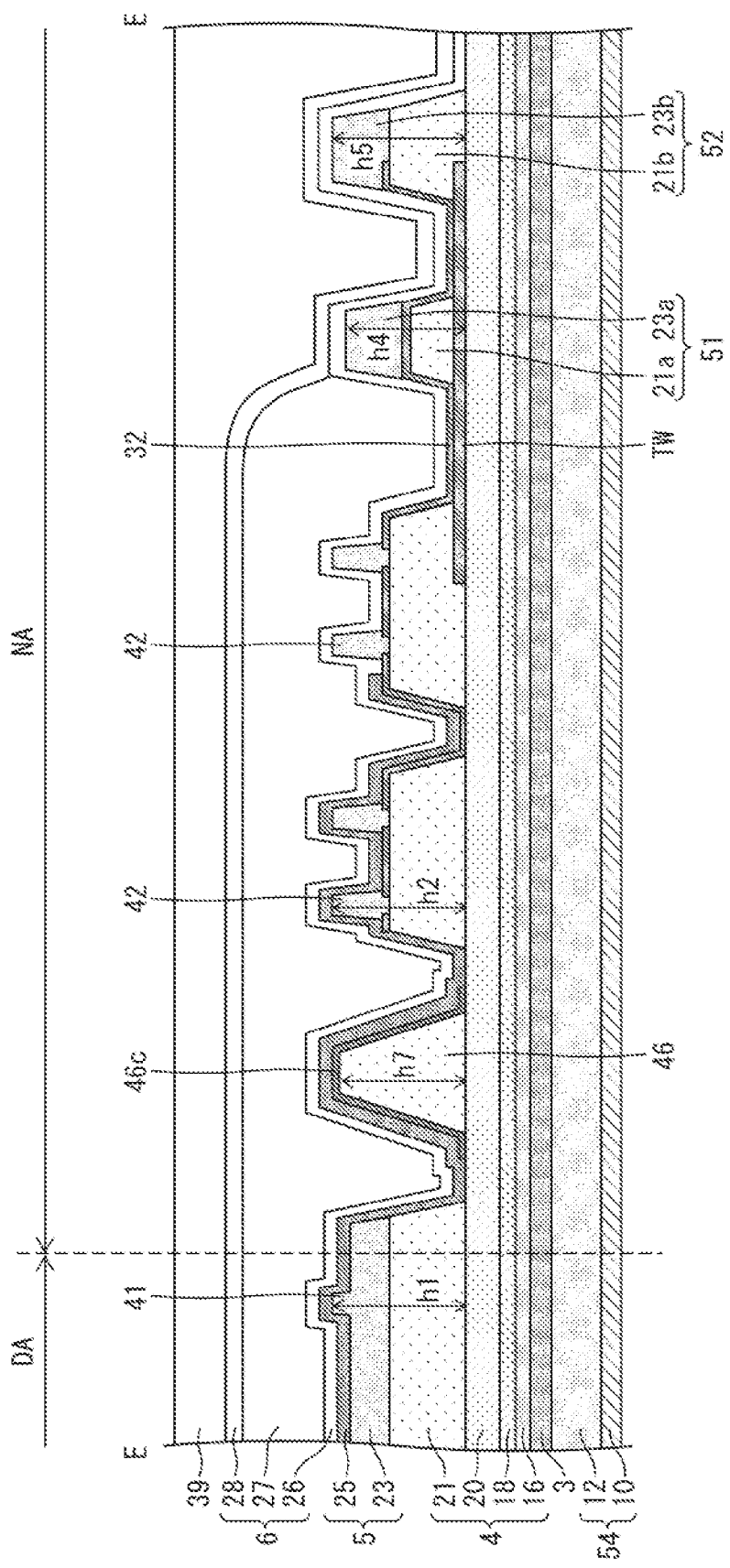

FIG. 9 is a cross-sectional view of the display device shown in (a) of FIG. 7 taken along line E-E.

DESCRIPTION OF EMBODIMENTS

Embodiment 1

The following will describe an embodiment of the disclosure in detail with reference to drawings. Shapes, dimensions, relative positions, and other like factors depicted in the drawings are mere examples and do not provide any basis on which the scope of the disclosure should be narrowly construed.

Method of Manufacturing Display Device and Structure of Display Device

Throughout the following description, expressions like "component A is in the same layer as component B" indicate that components A and B are formed in a single process or step (film forming step), expressions like "component A underlies/is below component B" indicate that component A is formed in an earlier process or step than component B, and expressions like "component A overlies/is on/is above component B" indicate that component A is formed in a later process or step than component B.

Figure 1:
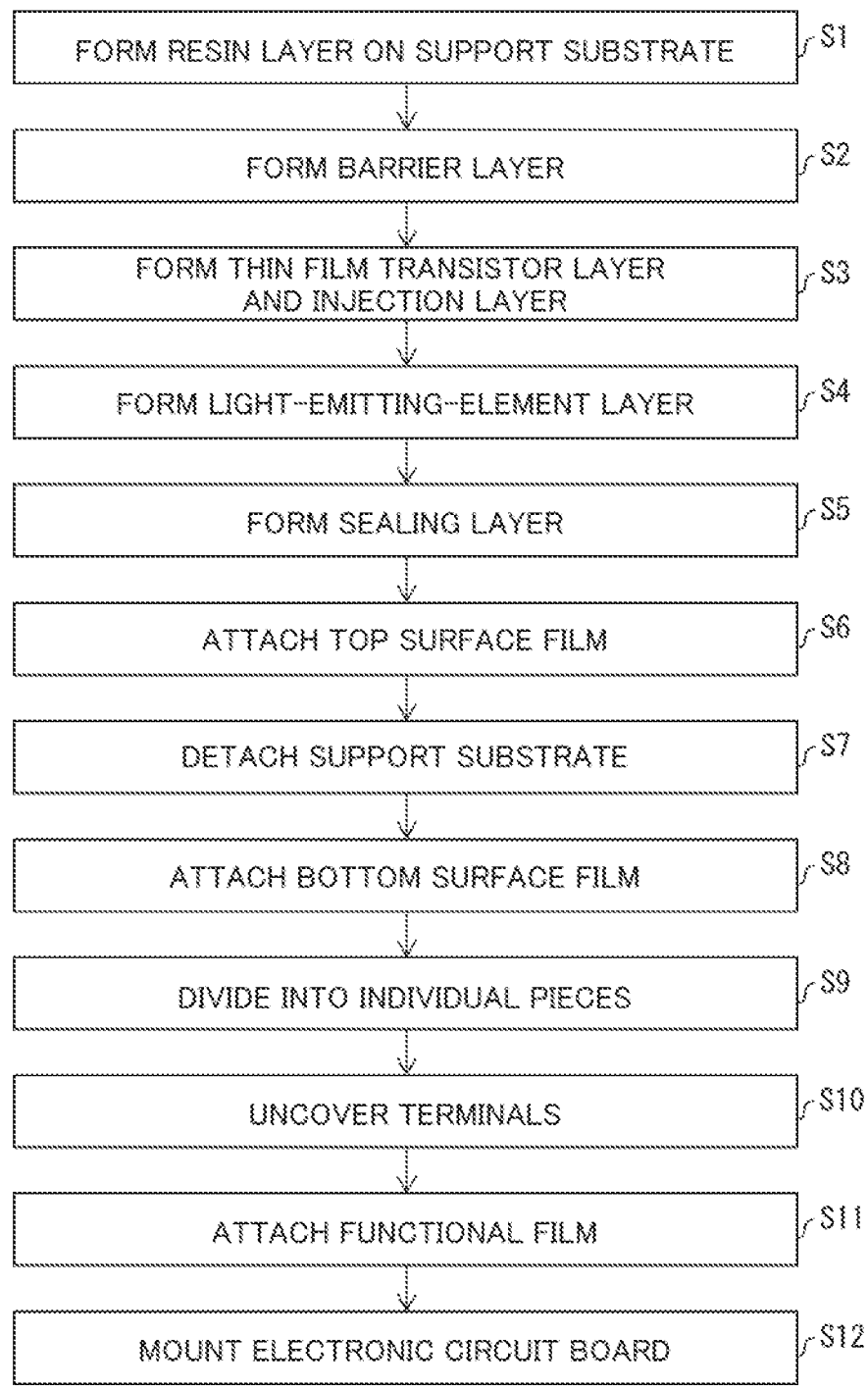
FIG. 1 is a flow chart representing an exemplary method of manufacturing a display device in accordance with some embodiments of the present invention.

FIG. 1 is a flow chart representing an exemplary method of manufacturing a display device in accordance with some embodiments of the disclosure. Portion (a) of FIG. 2 is a schematic plan view of an exemplary structure of a display device 2 in accordance with the present embodiment, and (b) of FIG. 2 is an enlarged schematic plan view of a structure of a display area of the display device shown in (a) of FIG. 2. FIG. 3 is a schematic cross-sectional view of the structure of a display area DA of the display device 2 shown in (b) of FIG. 2. Portion (a) of FIG. 4 is a schematic cross-sectional view, taken along line A-A, of an exemplary structure of a portion of a frame area NA of the display device 2 shown in (a) of FIG. 2 that is proximate to the display area DA, and (b) of FIG. 4 is a schematic cross-sectional view, taken along line B-B, of an exemplary structure of a bending portion FL in the frame area NA of the display device 2 shown in (a) of FIG. 2.

To manufacture a flexible display device including a bending portion, a resin layer 12 is first formed on a transparent support substrate (e.g., mother glass) as shown in FIGS. 3 to 4 (step S1). Next, a barrier layer 3 is formed (step S2). A thin film transistor layer 4 and an injection resin layer 35 are then formed (step S3). Next, a top-emission light-emitting-element layer 5 is formed (step S4). Next, a sealing layer 6 is formed (step S5). Next, a top surface film is attached onto the sealing layer 6 (step S6).

Next, the support substrate is then detached from the resin layer 12 under, for example, laser irradiation (step S7). Next, a bottom surface film 10 is attached to the bottom face of the resin layer 12 to form a flexible substrate 54 including the bottom surface film 10 and the resin layer 12 (step S8). Next, the stack body including the bottom surface film 10, the resin layer 12, the barrier layer 3, the thin film transistor layer 4, the light-emitting-element layer 5, the sealing layer 6, and the top surface film is diced to obtain a plurality of individual pieces (step S9). Next, the top surface film on the thin film transistor layer 4 is detached from a terminal section TM located along a side of the frame area, to uncover terminals (step S10). Next, a functional film 39 is attached to the obtained individual pieces (step S11). Next, an electronic circuit board (e.g., an IC chip or an FPC) is mounted to the terminal section TM (step S12). Steps S1 to S12 are carried out using display manufacturing equipment (including film-forming apparatus that performs steps S1 to S5).

The resin layer 12 is made of, for example, polyimide. The resin layer 12 may be replaced by a combination of two resin films (e.g., polyimide films) and an inorganic insulation film interposed between these two resin films.

The barrier layer 3 prevents foreign materials such as water and oxygen from reaching the thin film transistor layer 4 and the light-emitting-element layer 5. The barrier layer 3 may include, for example, a silicon oxide film, a silicon nitride film, a silicon oxynitride film, or a stack of these films. The films can be formed by CVD.

The thin film transistor layer 4 includes: a semiconductor film 15; an inorganic insulation film 16 (gate insulation film) overlying the semiconductor film 15; gate electrodes GE and gate lines GH overlying the inorganic insulation film 16 (gate insulation film); an inorganic insulation film 18 (first interlayer insulation film) overlying the gate electrodes GE and the gate lines GH; capacitor electrodes CE overlying the inorganic insulation film 18; an inorganic insulation film 20 (second interlayer insulation film) overlying the capacitor electrodes CE; source lines SH (first lines) and terminal lines TW (first lines) overlying the inorganic insulation film 20; and a planarization film 21 overlying the source lines SH and the terminal lines TW.

The semiconductor film 15 is made of, for example, a low-temperature polysilicon (LTPS) or an oxide semiconductor (e.g., In—Ga—Zn—O-based semiconductor). Thin film transistors (TFTs) are structured so as to include the semiconductor film 15 and the gate electrodes GE. FIG. 3 shows the thin film transistors as having a top-gate structure. Alternatively, the thin film transistors may have a bottom-gate structure.

The gate electrodes GE, the gate lines GH, the capacitor electrodes CE, the source lines SH, and the terminal lines TW are made of, for example, a monolayer or multilayer film of at least one of metals of aluminum, tungsten, molybdenum, tantalum, chromium, titanium, and copper.

The inorganic insulation films 16, 18, and 20 may be made of, for example, a CVD-formed film of silicon oxide (SiOx), silicon nitride (SiNx), or silicon oxynitride (SiNO) or a stack of these films. The planarization film 21 may be made of, for example, an organic material, such as polyimide or acrylic resin, that can be provided by printing or coating technology.

The light-emitting-element layer 5 includes: anodes 22 ("pixel electrodes") overlying the planarization film 21; insulating edge covers 23 covering the edges of the anodes 22; an EL (electroluminescence) active layer 24 overlying the edge covers 23; and cathodes 25 overlying the EL active layer 24. The edge covers 23 are formed, for example, by applying an organic material such as polyimide or acrylic resin and subsequently patterning the applied organic material by photolithography.

A light-emitting element ES, which is either a QLED (quantum dot light-emitting diode) or an OLED (organic dot light-emitting diode, including one of the anodes 22, the EL active layer 24, and one of the cathodes 25, is formed for each subpixel in the light-emitting-element layer 5. There are also provided subpixel circuits for controlling the light-emitting elements ES in the thin film transistor layer 4.

The EL active layer 24 includes, for example, a stack of a hole injection layer, a hole transport layer, a light-emitting layer, an electron transport layer, and an electron injection layer arranged in this order when viewed from below. The light-emitting layer is formed in an insular manner for each opening 23c in the edge cover 23 (i.e., for each subpixel) by vapor deposition or inkjet technology. Other layers are provided either in an insular manner or as a common layer across all the openings. One or more of the hole injection layer, the hole transport layer, the electron transport layer, and the electron injection layer may be omitted.

A FMM (fine metal mask) is used as a vapor deposition mask if a light-emitting layer is formed for OLEDs by vapor deposition. A FMM is a sheet of, for example, an invar material with numerous vapor deposition openings. An organic material that has passed through a vapor deposition opening forms an insular light-emitting layer (for each subpixel).

An insular QLED light-emitting layer (for each subpixel) can be formed, for example, by applying a solvent containing diffused quantum dots by inkjet printing.

The anode 22 includes a stack of, for example, ITO (indium tin oxide) and either Ag (silver) or a Ag-containing alloy or is made of a Ag- or Al-containing material, so that the anode 22 can be light-reflective. The cathode 25 may be made of a transparent conductive material such as a Ag, Au, Pt, Ni, or Ir thin film, a Mg—Ag alloy thin film, ITO, or IZO (indium zinc oxide), so that the cathode 25 can be transparent. When the display device is not of a top-emission type, but of a bottom-emission type, the bottom surface film 10 and the resin layer 12 are transparent, the anode 22 is a transparent electrode, and the cathode 25 is a reflective electrode.

In the light-emitting elements ES, holes and electrons recombine in the light-emitting layer due to a drive current flowing between the anode 22 and the cathode 25, to produce excitons that transition from the lowest unoccupied molecular orbital (LUMO) or the conduction band to the highest occupied molecular orbital (HOMO) or the valence band to emit light.

The sealing layer 6 is transparent and includes an inorganic sealing film 26 covering the cathode 25, an organic buffer film 27 overlying the inorganic sealing film 26, and an inorganic sealing film 28 overlying the organic buffer film 27. The sealing layer 6, covering the light-emitting-element layer 5, prevents foreign materials such as water and oxygen from reaching the light-emitting-element layer 5.

The inorganic sealing film 26 and the inorganic sealing film 28 are inorganic insulation films and may each include, for example, a silicon oxide film, a silicon nitride film, a silicon oxynitride film, or a stack of these films. The films can be formed by CVD. The organic buffer film 27 is a transparent organic film that exhibits a planarization effect. The organic buffer film 27 may be made of an organic material, such as acrylic resin, that can be provided by printing or coating technology. The organic buffer film 27 may be formed, for example, by inkjet printing. When that is actually the case, there may be provided a bank in the non-display area to stop liquid drops.

The bottom surface film 10 is, for example, a PET film attached to the bottom face of the resin layer 12 after the support substrate is detached, thereby providing for a highly flexible display device. The functional film 39 has, for example, at least one of an optical compensation function, a touch sensor function, and a protection function.

The display area DA includes a plurality of subpixels formed therein. In the display area DA are there provided first photospacers 41 to prevent the vapor deposition mask used in the vapor deposition formation of the light-emitting layer in the OLEDs from coming into contact with the edge covers 23. The first photospacers 41 project from the edge covers 23 and are made of the same material and in the same layer as the edge covers 23 by, for example, patterning a material for the edge covers 23 using a halftone mask or a gray tone mask.

The frame area NA is a non-display area outside the display area DA and surrounds the display area DA. The frame area NA includes: those portions close to the display area DA in which there are provided second photospacers 42, a first bank 51, a second bank 52, and a trench 53; and the terminal section TM to which an electronic circuit board is mounted.

The second photospacers 42 prevent the vapor deposition mask used in the vapor deposition formation of the EL active layer 24 from coming into contact with the edge covers 23. The second photospacers 42 project from the planarization film 21 and are made of the same material and in the same layer as the edge covers 23 by, for example, patterning a material for the edge covers 23 using a halftone mask or a gray tone mask.

The first bank 51 is shaped like a frame around the display area DA so as to specify the ends of the organic buffer film 27. The second bank 52 is disposed outside the first bank 51 (opposite from the display area DA) and shaped like a frame around the display area DA. The first bank 51 and the second bank 52 each include a portion made of the same material and in the same layer as, for example, one or more of the injection resin layer 35, the planarization film 21, and the edge covers 23.

The trench 53 is an opening provided inside the first bank 51 (on the same side of the first bank 51 as the display area DA) and shaped like a groove in the planarization film 21 around the display area DA. The trench 53 prevents the water permeating the planarization film 21 from reaching the display area DA.

The injection resin layer 35 is an organic insulate material and may be made of, for example, a photosensitive organic material, such as polyimide or acrylic resin, that can be provided by printing or coating technology. The injection resin layer 35 may be made of either the same material as or a different material than the planarization film 21. The bending portion FL is located between the display area DA and the terminal section TM. The inorganic insulation films 16, 18, and 20 terminate in an opening 34 in the bending portion FL, and the opening 34 is filled by the injection resin layer 35. This structure renders the display device 2 easy to bend in the bending portion FL.

The present embodiment relates in general to a method of manufacturing the display device described above and in particular to steps S3 and S4 of the method and also in particular to a display device including a substrate subjected to a vapor deposition process.

Structure of Display Device

As described above with reference to FIGS. 1 to 4, the display device 2 in accordance with the present embodiment includes: the display area DA; and the frame area NA surrounding the display area DA. The display device 2 in accordance with the present embodiment further includes: the flexible substrate 54 (substrate) including the bottom surface film 10 and the resin layer 12; the barrier layer 3; the thin film transistor layer 4 including the semiconductor film 15, the inorganic insulation film 16, the gate electrodes GE and the gate lines GH, the inorganic insulation film 18, the capacitor electrodes CE, the inorganic insulation film 20, the source lines SH (first lines) and the terminal lines TW, and the planarization film 21 in this sequence; the light-emitting-element layer 5 including the anodes 22 (first electrodes), the edge covers 23, the EL active layer 24 (light-emitting layer), and the cathodes 25 (second electrodes) in this sequence; the sealing layer 6 including the inorganic sealing film 26 (first inorganic sealing insulation film), the organic buffer film 27 (organic film), and the inorganic sealing film 28 (second inorganic sealing insulation film) in this sequence so as to cover the light-emitting-element layer 5; and the functional film 39. The edge covers 23 cover the edges (end regions) of the anodes 22 and have the openings 23c therein so as to cover the anodes 22.

The first photospacers 41 reside in the display area DA of the display device 2 in accordance with the present embodiment. The first photospacers 41 project from the edge covers 23, have the surfaces thereof covered by the cathodes 25, and are made of the same material and in the same layer as the edge covers 23.

The second photospacers 42 reside in the frame area NA. The second photospacers 42 project from the planarization film 21, have the surfaces thereof covered by the cathodes 25, and are made of the same material and in the same layer as the edge covers 23. FIGS. 2 and 4 and similar drawings referred to in the following description show, for convenience of illustration, two lines of second photospacers 42 between the trench 53 and the display area DA and another two lines of second photospacers 42 between the trench 53 and the first bank 51. In practice, there ray be provided more or fewer lines of second photospacers 42.

The terminal section TM resides along a side of the frame area NA. The bending portion FL resides between the terminal section TM in the frame area NA and the display area DA. The opening 34 resides in the inorganic insulation films 16, 18, and 20 in the bending portion FL so as to expose the resin layer 12 on the flexible substrate 54. The injection resin layer 35 fills up the opening 34.

The first bank 51 resides between the bending portion FL in the frame area NA and the display area DA and surrounds the display area DA to specify the ends of the organic buffer film 27. The second bank 52, surrounding the first bank 51, also resides between the bending portion FL in the frame area NA and the display area DA.

Lightning Rod Photospacers

Portion (a) of FIG. 5 is an enlarged schematic plan view of an exemplary structure of a portion C of the display device shown in (a) of FIG. 2, and (b) of FIG. 5 is a cross-sectional view of the portion C shown in (a) of FIG. 5 taken along line D-D.

Referring to FIGS. 2 and 5, the display device 2 in accordance with the present embodiment further includes lightning rod photospacers 44 in a part of the frame area NA opposite the first bank 51 from the display area DA FIG. 2 shows, for convenience of illustration, a line of lightning rod photospacers 44 between the second bank 52 and the bending portion FL. This is however not the only feasible arrangement of the lightning rod photospacers 44. Alternatively or additionally, the lightning rod photospacers 44 may be provided between the first bank 51 and the second bank 52 and/or between the bending portion FL and the terminal section TM. In practice, there may be provided more lightning rod photospacers 44.

The structure referred to as the "lightning rod photospacer" in the present and subsequent embodiments needs only to function as a lightning rod, in other words, a path through which the electric charge on the vapor deposition mask or the vapor-deposition-target substrate can flow out. The structure does not need to function as a spacer.

The lightning rod photospacers 44 are arranged in an insular manner and project from the top face of the inorganic insulation film 20. Each lightning rod photospacer 44 includes: a first projection portion 44a (partial) made of the same material and in the same layer as the planarization film 21; and a second projection portion 44b made of the same material and in the same layer as the injection resin layer 35. The surface of the first projection portion 44a is covered by a first metal film 44c made of the same material and in the same layer as the anode 22. The surface of the second projection portion 44b is covered by a second metal film 44d made of the same material and in the same layer as the source line SH and the terminal line TW. Each first metal film 44c is connected to the associated second metal film 44d.

Referring to FIGS. 2 and 5, the first metal films 44c are arranged in an insular manner so as to individually cover the lightning rod photospacers 44. The second metal film 44d is shaped like a frame around the display area DA so as to connect the lightning rod photospacers 44 with each other. Either one or both of the first metal film 44c and the second metal film 44d is/are preferably shaped like a frame around the display area DA.

The first metal film 44c and the second metal film 44d may not be connected to any other members at all. In the manufacturing process, the first metal film 44c is preferably connected to a short-ring structure via the associated second metal film 44d. The short-ring structure is a structure for short-circuiting, for example, the gate lines GH and the source lines SH in the manufacturing process.

Manufacturing Method

A description is now given of an exemplary method of manufacturing the display device 2 including the lightning rod photospacers 44 in accordance with the present embodiment.

FIG. 6 is a flow chart representing exemplary steps S3 and S4 of a method of manufacturing the display device 2 shown in (a) of FIG. 2.

Referring to FIG. 6, first, the semiconductor film 15, the inorganic insulation film 16, the gate electrodes GE and the gate lines (GI, the inorganic insulation film 18, the capacitor electrodes CE, and the inorganic insulation film 20 underlying the source lines SH and the terminal lines TW in the thin film transistor layer 4 are formed in this sequence on the resin layer 12 and the barrier layer 3 stacked on a support substrate (step S31). A through hole is then formed through the inorganic insulation films 16, 18, and 20 in the display area DA so as to expose the semiconductor film 15, and the groove-like opening 34 is formed in the inorganic insulation films 16, 18, and 20 in the bending portion FL in the frame area NA so as to expose the resin layer 12 (step S32).

Subsequently, a photosensitive resin that is a material for the injection resin layer 35 is applied to a part of the frame area NA opposite the first bank 51 from the display area DA so as to fill up the opening 34. The applied photosensitive resin is then patterned by photolithography to form the injection resin layer 35 filling the opening 34 and the second projection portions 44b residing in the locations of the lightning rod photospacers 44 (step S33).

Next, a layer of conductive material for the source lines SH and the terminal lines TW is disposed across the entire surface and patterned by etching to form wiring such as the source lines SH and the terminal lines TW and the second metal film 44d (step S34).

Subsequently, the planarization film 21 is formed (step S35). In step S35, the planarization film 21 naturally makes lumps in the locations of the lightning rod photospacers 44 over other locations due to the presence of the second projection portions 44b.

Next, the trench 53 is formed so as to expose the inorganic insulation film 20 from below the planarization film 21 (step S36). Simultaneously in step S36, the planarization film 21 is removed from around the locations of the lightning rod photospacers 44 to form the first projection portions 44a of the lightning rod photospacers 44 from the planarization film 21. Also simultaneously with this, lower portions 21a and 21b of the first bank 51 and the second bank 52 are formed.

Subsequently, a layer of conductive material for the anodes 22 is disposed across the entire surface and patterned by etching to form the anodes 22 and the first metal film 44c (step S41).

Subsequently, a photosensitive resin that is a material for the edge covers 23 is applied across the entire surface and patterned by photolithography to form the edge covers 23 with the openings 23c, the first photospacers 41 and the second photospacers 42, and upper portions 23a and 23b of the first bank 51 and the second bank 52.

A vapor deposition process is then carried out to form the EL active layer 24 (step S43). In step S43, the support substrate, as well as a stack body of the thin film transistor layer 4, the anodes 22, and the edge covers 23 thereon, is fed into a vapor deposition device, aligned with a vapor deposition mask, and placed on the vapor deposition mask in contact with the vapor deposition mask via the first photospacers 41 and the second photospacers 42.

In step S43, the first metal film 44c covering the surfaces of the lightning rod photospacers 44 is positioned in contact with, or in proximity to, the vapor deposition mask. Therefore, the electric charge on the vapor deposition mask more readily flows to the first metal film 44c than to the anodes 22, and the electric charge on the vapor-deposition-target substrate more readily flows from the first metal film 44c to the vapor deposition mask than from the anodes 22. ESD between the vapor deposition mask and vapor-deposition-target mask more readily occurs between the vapor deposition mask and the first metal film 44c than between the vapor deposition mask and the anodes 22. This property prevents ESD between the vapor deposition mask and the anodes 22, thereby preventing surge current in the thin film transistors (so-called pixel transistors) connected to the anodes 22. This mechanism prevents the display device 2 from suffering from low manufacturing yield and reliability due to, for example, a shift in the operating voltage threshold of the pixel transistor or a degradation of the current-voltage characteristics of the pixel transistor.

Thereafter, the cathode 25 is formed so as to cover the surface of the EL active layer 24, the edge cover 23, the first photospacers 41, and the second photospacers 42 (step S44). The cathode 25 does not necessarily cover the surfaces of some of the second photospacers 42 as shown in FIG. 4.

Height of Lightning Rod Photospacers

Referring to FIG. 3, the top face of the planarization film 21 has a height $h10$ where the top face underlies the opening 23c in the edge cover 23 for exposing the anode 22. The top face of the first photospacer 41 has a height $h1$. Referring to FIG. 4, the top face of the second photospacer 42 has a height $h2$, the top face of the first bank 51 has a height $h4$, and the top face of the second bank 52 has a height $h5$. Referring to FIC 5, the top face of the lightning rod photospacer 44 has a height $h3$. All these heights are measured from the top face of the inorganic insulation film 20.

The heights $h1$, $h2$, $h3$, $h4$, and $h5$ are preferably substantially all equal.

When the lightning rod photospacers 44 are in contact with the vapor deposition mask, the lightning rod photospacers 44 can most effectively prevent ESD between the vapor deposition mask and the anodes 22 because the vapor deposition mask and the vapor-deposition-target substrate can discharge through the first metal films 44c. The lightning rod photospacers 44 are hence preferably in contact with the vapor deposition mask during vapor deposition. Because the vapor deposition mask sags along the periphery thereof, the lightning rod photospacers 44 can come into contact with the vapor deposition mask even when the lightning rod photospacers 44 are lower than the first photospacers 41. It may therefore be that $h3<h1$. In addition, because the surfaces of the lightning rod photospacers 44 are covered by the first metal films 44c, and the vapor deposition process is carried out inside a vacuum chamber, the lightning rod photospacers 44 function as lightning rods even when the lightning rod photospacers 44 are separated from the vapor deposition mask. It may therefore be that $h3<\min(h1,h2,h4,h5)$. The function, $\min(h1,h2,h4,h5)$, in the present specification gives the smallest of the heights $h1$, $h2$, $h4$, and $h5$.

The shortest distance from the first metal film 44c to the vapor deposition mask is preferably shorter than the shortest distance from the anodes 22 to the vapor deposition mask, so that the lightning rod photospacers 44 can function as lightning rods. It is therefore preferable if $h10<h3$.

Additionally, preferably, the second photospacers 42 in the frame area NA come into contact with the vapor deposition mask before the first photospacers 41 in the display area DA come into contact with the vapor deposition mask. It is therefore preferable if $h1<h2$. Furthermore, because the first bank 51 specifies the ends of the organic buffer film 27, the first bank 51 is preferably not damaged by the vapor deposition mask. It is therefore more preferable if $h4<h2$ and $h4<h5$.

Embodiment 2

The following will describe another embodiment of the disclosure in detail with reference to drawings. For convenience of description, members of the present embodiment that have the same function as members of the preceding embodiment are indicated by the same or similar reference numerals, and description thereof is not repeated.

Portion (a) of FIG. 7 is a schematic plan view of an exemplary structure of a display device 2 in accordance with the present embodiment, and (b) of FIG. 7 is an enlarged schematic plan view of a structure of a display area of the display device shown in (a) of FIG. 7. FIG. 8 is a schematic cross-sectional view of the structure of the display area DA shown in (b) of FIG. 7 taken along line F-F.

FIG. 8 does not show components in the thin film transistor layer 4 other than the pixel transistors. FIG. 9 is a schematic cross-sectional view, taken along line E-E, of a structure of a portion of a frame area NA of the display device 2 shown in (a) of FIG. 7 that is proximate to the display area DA.

Referring to FIGS. 7 to 9, the display device 2 in accordance with the present embodiment includes lightning rod photospacers 45 and 46 in replace of the lightning rod photospacers 44 of Embodiment 1. The lightning rod photospacers 45 are provided in the display area DA, and the lightning rod photospacers 46 are provided in a part of the frame area NA between the display area DA and the first bank 51. FIG. 7 shows, for convenience of illustration, a line of lightning rod photospacers 46 between the display area DA and the second photospacers 42. This is however not the only feasible arrangement of the lightning rod photospacers 46. Alternatively or additionally, the lightning rod photospacers 46 may be provided among the second photospacers 42 and/or between the second photospacers 42 and the first bank 51. In practice, there may be provided more lightning rod photospacers 46.

The lightning rod photospacers 45 in the display area DA are arranged in an insular manner, project from the planarization film 21 and also from the edge cover 23, and are made of the same material and in the same layer as the planarization film 21. There is provided a first metal film 45c covering the surfaces of the lightning rod photospacers 45. The first metal film 45c is provided in the form of a lattice so as to interconnect the lightning rod photospacers 45 in the display area DA.

The lightning rod photospacers 46 in the frame area NA are arranged in an insular manner, project from the inorganic insulation film 20, and are made of the same material and in the same layer as the planarization film 21. There is provided a first metal film 46c covering the surfaces of the lightning rod photospacers 46. The first metal film 46c is shaped like a frame around the display area DA so as to interconnect the lightning rod photospacers 46.

The first metal films 45c and 46c may not be connected to any other members at all. In the manufacturing process, the first metal films 45c and 46c are preferably connected to a short-ring structure.

Referring to FIG. 8, the top face of the lightning rod photospacer 45 has a height $h6$. Referring to FIG. 9, the top face of the lightning rod photospacer 45 has a height $h7$. All these heights are measured from the top face of the inorganic insulation film 20.

Similarly to the preceding embodiment, the lightning rod photospacers 45 and 46 can most effectively prevent ESD to the anodes 22 when the lightning rod photospacers 45 and 46 are in contact with the vapor deposition mask. It is therefore preferable if h6=h1 and h7=h1. However, similarly to the preceding embodiment, the lightning rod photospacers 45 and 46 function as lightning rods even when the lightning rod photospacers 45 and 46 are separated from the vapor deposition mask. It may therefore be that h6<h1 or h7<h1. In addition, similarly to the preceding embodiment, the shortest distance from the first metal films 45c and 46c to the vapor deposition mask is preferably shorter than the shortest distance from the anodes 22 to the vapor deposition mask, so that the lightning rod photospacers 45 and 46 can function as lightning rods. It is therefore preferable if h10<h6 and h10<h7.

Furthermore, the heights h6 and h7 of the top faces of the lightning rod photospacers 45 and 46 are preferably greater than the height of the top face of the edge cover 23. In such a case, because the first metal film 45c repels the material for the edge covers 23, openings 23d naturally form in the edge covers 23, exposing the lightning rod photospacers 45, when the edge covers 23 are formed (step S42). There is hence no need to modify the photolithographic patterning of the edge covers 23 to form the openings 23d and no need to add another step to form the openings 23d in the edge covers 23.

Unlike the lightning rod photospacers 44 in accordance with the preceding embodiment, the lightning rod photospacers 45 and 46 in accordance with the present embodiment are exclusively made of the same material and in the same layer as the planarization film 21 and do not at all reside in the same layer as the injection resin layer 35.

The lightning rod photospacers 45 and 46 in accordance with the present embodiment become available when the planarization film 21 is made of a photosensitive resin. Specifically, in step S33, the inorganic insulation film 20 is left exposed where the lightning rod photospacers 44 are going to be formed. Then, in step S35, a photosensitive resin that is the material for the planarization film 21 is applied across the entire surface and patterned by photolithography to form the lightning rod photospacers 45 and 46 and the edge covers 23 with the openings 23c and 23d.

Advantages

In the preceding embodiment, the electric charge on the vapor deposition mask or the vapor-deposition-target substrate readily flows to the first metal films 44c covering the surfaces of the lightning rod photospacers 44. Likewise, the electric charge readily flows to the first metal films 45c and 46c covering the surfaces of the lightning rod photospacers 45 and 46 in the present embodiment. The lightning rod photospacers 45 and 46 in accordance with the present embodiment therefore prevents the display device 2 from suffering from low manufacturing yield and reliability by restraining surge current in the pixel transistors, similarly to the lightning rod photospacers 44 in accordance with the preceding embodiment.

Furthermore, the lightning rod photospacers 45 and 46 in accordance with the present embodiment contains nothing that is made from the injection resin layer 35. The lightning rod photospacers 45 and 46 in accordance with the present embodiment can be therefore formed in display devices including no injection resin layer 35 (in other words, flexible and non-flexible display devices including no bending portion), to prevent the display device including no injection resin layer 35 from suffering from low manufacturing yield and reliability.

There is no need to form the opening 34 and the injection resin layer 35 in the manufacture of a flexible display device with no bending portion. There is generally no need to, for example, form a resin layer and reconnect a base member in the manufacture of a non-flexible display device. Therefore, for example, steps S2 to S5 are carried out to form a stack on a glass substrate before the process proceeds to step S9. A transparent sealing member may be attached using a sealing adhesive in a nitrogen atmosphere in the manufacture of a non-flexible display device, as an alternative or addition to the forming of the sealing layer 6. The transparent sealing member may be prepared from, for example, glass or plastics and preferably has a concave shape.

Either or both of the lightning rod photospacers 45 and 46 in accordance with the present embodiment may be provided in a display device in combination with the lightning rod photospacers 44 in accordance with the preceding embodiment.

General Description

The disclosure, in aspect 1 thereof, is directed to a display device including: a substrate; a thin film transistor layer on the substrate, the thin film transistor layer including an inorganic insulation film, a first line, and a planarization film in this sequence; and a light-emitting-element layer including a first electrode, an edge cover, a light-emitting layer, and a second electrode in this sequence, the edge cover covering an end of the first electrode and having an opening therein so as to expose the first electrode, the display device having a display area and a frame area surrounding the display area, the display device further including: a first photospacer in the display area, the first photospacer projecting from the edge cover and having a surface thereof covered by the second electrode; a second photospacer in the frame area, the second photospacer projecting from the planarization film and having a surface thereof covered by the second electrode; and a third photospacer in either one or both of the display area and the frame area, the third photospacer including the planarization film and having a surface thereof covered by a first metal film made of a same material and in a same layer as the first electrode.

In aspect 2 of the disclosure, the display device of aspect 1 may be configured such that the third photospacer is provided in an insular manner in the frame area so as to project from the inorganic insulation film.

In aspect 3 of the disclosure, the display device of aspect 2 may be configured such that the substrate is a flexible substrate, the display device further includes: a terminal section along a side of the frame area; and a bending portion between the terminal section in the frame area and the display area, the bending portion has an opening in the inorganic insulation film so as to expose the flexible substrate, and the display device further includes an injection layer filling the opening.

In aspect 4 of the disclosure, the display device of aspect 3 may be configured such that the third photospacer further includes a part made of a same material and in a same layer as the injection layer, the part having a surface thereof covered by a second metal film made of a same material and in a same layer as the first line.

In aspect 5 of the disclosure, the display device of aspect 2 may be configured to further include: a first inorganic sealing insulation film, an organic film, and a second inorganic sealing insulation film in this sequence so as to cover the light-emitting-element layer; and a bank in the frame area around the display area, the bank being configured to specify ends of the organic film.

In aspect 6 of the disclosure, the display device of aspect 5 may be configured such that the third photospacer is provided in a part of the frame area opposite the bank from the display area.

In aspect 7 of the disclosure, the display device of aspect 6 may be configured such that either one or both of the first metal film and the second metal film is/are shaped like a frame surrounding the display area.

In aspect 8 of the disclosure, the display device of aspect 1 may be configured such that the third photospacer is provided so as to project from a top face of the planarization film in such a manner that the third photospacer has a top face higher than a part of the top face of the planarization film that underlies the opening in the edge cover.

In aspect 9 of the disclosure, the display device of aspect 8 may be configured such that the third photospacer is provided so as to project from the edge cover.

In aspect 12 of the disclosure, the display device of aspect 11 may be configured such that the third photospacer is provided in the display area.

In aspect 10 of the disclosure, the display device of aspect 9 may be configured such that the first metal film is provided in a lattice-like form in the display area.

In aspect 12 of the disclosure, the display device of aspect 8 may be configured to further include: a first inorganic sealing insulation film, an organic film, and a second inorganic sealing insulation film in this sequence so as to cover the light-emitting-element layer; and a bank in the frame area around the display area, the bank being configured to specify ends of the organic film.

In aspect 13 of the disclosure, the display device of aspect 12 may be configured such that the third photospacer is provided in a part of the frame area between the bank and the frame area.

In aspect 14 of the disclosure, the display device of aspect 13 may be configured such that the first metal film is shaped like a frame surrounding the display area.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

REFERENCE SIGNS LIST

2 Display Device
4 Thin Film Transistor Layer
5 Light-emitting-element Layer
6 Sealing Layer
16, 18, 20 Inorganic Insulation Film
21 Planarization Film
22 Anode (First Electrode)
23 Edge Cover
23c, 23d Opening
24 EL Active Layer (Light-emitting Layer)
25 Cathode (Second Electrode)
26 Inorganic Sealing Film (First Inorganic Sealing Insulation Film)
27 Organic Buffer Film (Organic Film)
28 Inorganic Sealing Film (Second Inorganic Sealing Insulation Film)
34 Opening
35 Injection Resin Layer (Injection Layer)
41 First Photospacer
42 Second Photospacer
44, 45, 46 Lightning Rod Photospacer (Third Photospacer)
44a First Projection Portion
44b Second Projection Portion (Partial)
44c, 45c, 46c First Metal Film
44d Second Metal Film
51 First Bank (Bank)
54 Flexible Substrate (Substrate)
DA Display Area
FL Bending Portion
NA Frame Area
SH Source Line (First Line)
TM Terminal Section (First Line)

The invention claimed is:

1. A display device comprising:
a substrate;
a thin film transistor layer on the substrate, the thin film transistor layer including an inorganic insulation film, a first line, and a planarization film in this sequence; and
a light-emitting-element layer including a first electrode, an edge cover, a light-emitting layer, and a second electrode in this sequence, the edge cover covering an end of the first electrode and having an opening therein so as to expose the first electrode,
the display device having a display area and a frame area surrounding the display area,
the display device further comprising:
a first photospacer in the display area, the first photospacer projecting from the edge cover and having a surface thereof covered by the second electrode;
a second photospacer in the frame area, the second photospacer projecting from the planarization film and having a surface thereof covered by the second electrode; and
a third photospacer in either one or both of the display area and the frame area, the third photospacer including the planarization film and having a surface thereof covered by a first metal film made of a same material and in a same layer as the first electrode,
wherein the third photospacer is provided in an insular manner in the frame area so as to project from the inorganic insulation film,
the substrate is a flexible substrate,
the display device further comprises:
a terminal section along a side of the frame area; and
a bending portion between the terminal section in the frame area and the display area,
the bending portion has an aperture in the inorganic insulation film so as to expose the flexible substrate, and
the display device further comprises an injection layer filling the aperture, and
wherein the third photospacer further includes a part made of a same material and in a same layer as the injection layer, the part having a surface thereof covered by a second metal film made of a same material and in a same layer as the first line.

2. The display device according to claim 1, further comprising:
a first inorganic sealing insulation film, an organic film, and a second inorganic sealing insulation film in this sequence so as to cover the light-emitting-element layer; and
a bank in the frame area around the display area, the bank being configured to specify ends of the organic film.

3. The display device according to claim 2, wherein the third photospacer is provided in a part of the frame area opposite the bank from the display area.

4. The display device according to claim 3, wherein either one or both of the first metal film and the second metal film is/are shaped like a frame surrounding the display area.

5. The display device according to claim 1, wherein the third photospacer is provided so as to project from a top face of the planarization film in such a manner that the third photospacer has a top face higher than a part of the top face of the planarization film that underlies the opening in the edge cover.

6. The display device according to claim 5, wherein the third photospacer is provided so as to project from the edge cover.

7. The display device according to claim 6, wherein the third photospacer is provided in the display area.

8. The display device according to claim 7, wherein the first metal film is provided in a lattice-like form in the display area.

9. The display device according to claim 5, further comprising:
a first inorganic sealing insulation film, an organic film, and a second inorganic sealing insulation film in this sequence so as to cover the light-emitting-element layer; and
a bank in the frame area around the display area, the bank being configured to specify ends of the organic film.

10. The display device according to claim 9, wherein the third photospacer is provided in a part of the frame area between the bank and the frame area.

11. The display device according to claim 10, wherein the first metal film is shaped like a frame surrounding the display area.

* * * * *